US006927639B2

(12) United States Patent
Chen

(10) Patent No.: US 6,927,639 B2
(45) Date of Patent: Aug. 9, 2005

(54) METHOD AND APPARATUS FOR GENERATING HIGH FREQUENCY SIGNALS BY A PLURALITY OF LOW FREQUENCY SIGNALS WITH MULTIPLE PHASES

(75) Inventor: Yu-Chen Chen, Taipei (TW)

(73) Assignee: ALI Corporation, Taipei (TW)

( * ) Notice: Subject to any disclaimer, the term of this patent is extended or adjusted under 35 U.S.C. 154(b) by 112 days.

(21) Appl. No.: 10/605,462

(22) Filed: Sep. 30, 2003

(65) Prior Publication Data
US 2004/0246058 A1 Dec. 9, 2004

(30) Foreign Application Priority Data

Jun. 3, 2003 (TW) ........................................ 92114981 A

(51) Int. Cl.$^7$ ........................ H03B 19/00; H03B 27/00; H03K 3/00
(52) U.S. Cl. ........................ 331/75; 331/57; 327/119; 327/294; 327/298
(58) Field of Search ...................... 331/45, 57, 74, 331/75; 327/116, 119–123, 291, 193, 294, 298

(56) References Cited

U.S. PATENT DOCUMENTS 6,150,855 A * 11/2000 Marbot ........................ 327/116

* cited by examiner

*Primary Examiner*—David Mis
(74) *Attorney, Agent, or Firm*—Winston Hsu

(57) ABSTRACT

Method and related apparatus for realizing frequency-multiplication by generating a high frequency signal according to a plurality of low frequency signals. The method includes: according to a plurality output signals generated by a phase-locked loop (PLL) or a delay-locked loop (DLL), generating a plurality of reference signals with a same frequency and different phases; when a number of the reference signals with signal level high is greater than a number of the reference signals with signal level low, making a signal level of the output signal remains a first level; otherwise, making the signal level of the output signal remains a second level substantially different from the first level. Thus the frequency of the output signals is a multiplication of the frequency of the input signals.

24 Claims, 14 Drawing Sheets

METHOD AND APPARATUS FOR GENERATING HIGH FREQUENCY SIGNALS BY A PLURALITY OF LOW FREQUENCY SIGNALS WITH MULTIPLE PHASES

BACKGROUND OF INVENTION

1. Field of the Invention

The invention relates to, and more particularly, to a circuit and a method for generating a high frequency signal by realizing frequency multiplication on low frequency signals, and more particularly to, a circuit and a method for generating a high frequency signal by realizing frequency multiplication on low frequency signals by a delay-locked loop or delay-locked loop.

2. Description of the Prior Art

In this modern society, all sorts of information, data, documents, communications, and audio and video signals are encoded in electrical format to increase the speed and efficiency for transmitting, processing, calculating, and storing. As a result, a variety of electrical circuits that are used to process these electrical signals have become a significant fundamental hardware in the development of the modern information industry. In any electrical circuitry, electrical signals have to be synchronized to a pulse for processing, transmitting, storing, and reading of those electrical signals. Different building blocks of an electrical structure usually have their timing synchronized to a pulse so the operation of different pulses such as the generation of pulses, the synchronization of pulses, the difference and adjustment of the pulses, and the multiplication and division of the frequency of pulses during synchronization are all the foremost research areas in the information technology industry.

Phase-locked loop and delay-locked loop are the most common type of building blocks used in circuits for operating pulse. Please refer to FIG. 1, it is a block diagram showing the functionality of a conventional phase-locked loop 10. the phase-locked loop 10 comprises a phase and frequency detector 12, a charge pump 14, a low pass filter 16, a voltage control oscillator 20, and two frequency dividers 18A, 18B. The detector 12 having two input terminals detects the frequency and phase difference of the inputted signals from the input terminals and sends out the results of the difference to the charge pump 14; the charge pump 14 is coupled to the low pass filter 16 for transforming the detection results of the detector 12 into corresponding voltage signals. The voltage control oscillator 20 receives the voltage signal output from the low pass filter 16 and generates a pair of pulses 24B whose frequency corresponds to the level of the voltage signal from the low pass filter 16. 1/Ka divider 18A divides the pulse 24A to become 26A so the frequency of the pulse 26A (counting the periods backwards) is 1/Ka of the frequency of the pulse 24A. The pulse 26A is sent back to the input terminal of the detector 12. Similarly the 1/Kb divider 18B can divide the pulse 24B to become the pulse 26B so the frequency of the pulse 26B is 1/Kb of that of the pulse 24B. The pulse 26B is sent back to the other input terminal of the detector 12.

The phase-locked loop 10 uses pulse 24A as a standard to generate and synchronize pulse 24A which stabilizes the frequency multiplication of pulse 24B. The operation of the phase-locked loop 10 is described in the following. The detector 12 detects the frequency and phase difference between the pulses 26A, 26B and transforms the difference into a voltage signal with the charge pump 14 and the low pass filter 16. The frequency of the pulse 24B is correspondingly adjusted by the voltage control oscillator 20. After the adjustment of the frequency of the pulse 24B the frequency of the pulse 26B is at the same time changed. The frequency and phase difference of the pulses 26B, 26A are again tested by the detector 12 and then sent through the charge pump 14 and low pass filter 16 to the voltage control oscillator 20 to control the frequency of pulse 24B. The above process for adjusting the frequency of the pulse 24B by the voltage control oscillator 20 according to the pulses 26A, 26B is repeated until the frequency and phase difference between the pulses 26A, 26B are zero therefore both frequency and time are synchronized. The phase-locked loop 10 completes the locking and the voltage control oscillator 20 can steadily output pulse 26B which is exactly in synchronization in frequency and time with the pulse 26A. As a result the pulses 26A, 26B are locked together. The frequency of pulse 24B (counting periods backwards) is the (Kb/Ka) fraction of the pulse 24A because the pulses 26A, 26B are divided by 1/Ka, 1/Kb respectively therefore Fb=(Kb/Ka)Fa, wherein Fa, Fb are the frequencies of the pulses 24A, 24B.

Apart from showing the conventional layout of the phase-locked loop 10, FIG. 1 also shows the conventional structure of the voltage control oscillator 20. The voltage control oscillator 20 can be made up of a plurality of differential buffers 22 (the differential buffer in the furthest left), wherein an input terminal (labeled as +) and an output terminal (labeled −) are separately electrically connected to the junction of between Na0 and Na5. The second differential buffer is electrically connected between Na5 and Na1 and so forth. The last differential buffer (the furthest right differential buffer in FIG. 1) is electrically connected to the junction between Na4 and Na9. The junctions Na9, Na10 are electrically connected together as well so the each differential buffer 22 is coupled to form a ring oscillator. The low pass filter 16 outputs a voltage signal to change the time delay of each differential buffer 22 which also changes the period of the pulse 24B. To further explain this phenomenon, please refer to FIG. 2 (and simultaneously refer to FIG. 1). FIG. 2 is a schematic diagram of the timing of the signal wave at different junctions of the voltage control oscillator 20. The horizontal axis represents time and the vertical axis represents the signal level. The waves C0, C1, C2, and the like till C9 represent the waves at the junction Na0, Na1, Na2, and the like to Na9 during the operation of the voltage control oscillator 20 in FIG. 1. The time period Td1 in FIG. 2 represents the delay time introduced by the differential buffer 22. For example, the wave C0 rises from a level low L to a level high H at time tp0 then the wave C5 at the junction Na5 falls from the level high H to the level low L at time tp1 after the furthest left differential buffer 22 introduces a time delay of Td1. Similarly, after the wave C5 shifts from the level high H to the level low L at tp1, the following differential buffer is activated so at tp2 (by adding a time delay Td1 from tp1) the wave C1 at the junction Na1 rises from the level low L to the level high H. By using the same process, each differential buffer 22 will activate the following differential buffer 22 to reverse the output signal after a time delay Td1 is applied. The furthest right differential buffer 22 in FIG. 1 shifts the wave C9 at the junction Na9 from the level high H to the level low L at tp3. The wave C0 (actually is also the wave C9) will again shifts level and this process repeats itself throughout the differential buffers. The voltage control oscillator 20 causes the waves C0 to C9 at the junctions Na0 to Na9 to swap and oscillate for outputting the pulse 24B (the waves C0, C9) at the junction Na9.

Please refer to FIG. 2, the waves C0 to C9 at the junctions Na0 to Na9 all have a period of T0 which is the time delay Td1 multiplied by the number of differential buffers 22 (there are nine differential buffers in FIG. 1, 2) and then further multiplied by 2. The low pass filter 16 outputs a voltage signal which can change the time delay Td1 introduced by each of the differential buffer 22 to control the frequency of the pulse 24B. From FIG. 2, the time delay introduced by the differential buffer 22 forms the phase difference between C1 and C9 (C0) causing the phase difference between the waves C1 and C9 to be evenly distributed within the 360 degrees that corresponds to the period T0.

Apart from the phase-locked loop, the delay-locked loop is also a commonly found building block in the circuits for operating pulse. Please refer to FIG. 3 which is schematic diagram of a conventional delay-locked loop 30 accompanied by two pulses circuits 28A, 28B. The delay-locked loop 20 comprises a detector 32, a charge pump 34, a low pass filter 36, and a variable control delay line (VCDL) 40. The detector 32 has two input terminals for detecting the phase difference of the two inputted signals. The charge pump 34 and the low pass filter 36 transforms the detection results from the detector 32 into voltage signals and transmits them to the delay-locked loop 40. The delay-locked loop 40 receives a pulse 46A and inserts a predefined time delay into the pulse 46A according to voltage signal from the low pass filter 36 and outputs a pulse 46B.

The delay-locked loop 30 synchronizes the pulse 46A, 46B without any phase difference. In modern electronic circuits (especially digital circuits), different circuit blocks usually require synchronized operation so a synchronized pulse with no phase difference (i.e. the rise and fall edge of signals have no time difference) is necessary for synchronized activation of different circuit blocks. In FIG. 3, the pulse circuits 28A, 28B are circuit blocks that are required to be activated simultaneously (for example, the pulse circuits 28A, 28B further comprise a plurality of logic gates, flip-flops, state machines, and the like). In order to activate and drive the different circuit blocks, the pulse needs to have an appropriate level of driving power. However a delay is experienced when using buffers to increase the level of the pulse and therefore a time difference (phase difference) exists in the original pulse. As a result the original pulse and the increased-power pulse cannot simultaneously trigger different circuit blocks. Under this circumstance, a delay-locked loop is required to generate two synchronized pulses with no phase difference for simultaneously using two different signals to drive two different circuit blocks. In FIG. 2, the delay-locked loop 30 generates another synchronized pulse 46B with no phase difference which uses pulses 46A, 46B to trigger the pulses circuits 28A, 28B needing synchronization. The operation of the delay-locked loop 30 is described in the following. The detector 32 detects the phase difference between the pulses 46A, 46B, and then charge pump 34 and the low pass filter 36 transform the phase difference into a voltage signal. After receiving the voltage signal, the delay-locked loop 40 will correspondingly adjust the phase difference of the pulse 46B. The detector 32 will again detect the phase difference between the pulse 46B and the pulse 46A and the delay-locked loop 40 will again adjust the pulse of the 46B according to the charge pump 34 and the low pass filter 36. The above process is repeated by adjusting the pulse 46B by the delay-locked loop 40 until there is no phase difference between the pulses 46A, 46B. As this instant, the pulses 46A, 46B are synchronized with no phase difference.

As illustrated in FIG. 3, the conventional delay-locked loop 40 comprises a plurality of buffers 42 (FIG. 3 is illustrated with nine buffers as an example) and each buffer is coupled to one another so a time delay can be applied to the input and output terminals according to the voltage signal outputted by the low pass filter 36. Taking the furthest left buffer 42 in FIG. 3 as an example, the input and output terminal are separately electrically connected between the junctions Nb0 and Nb1 to insert a time delay into the signal at the junctions Nb0, Nb1. Please refer back to FIG. 2 (simultaneously refer to FIG. 3), the waves C0, C1, and the like to C9 can be signals from the delay-locked loop 40 at the junctions Nb0, Nb1, and the like to Nb9. In FIG. 3, after the furthest left buffer 42 receives the pulse 46A of the wave C0 at the junction Nb0, a time delay Td2 is inserted to generate the wave C1 at the junction Nb1. Similarly, another buffer will insert another time delay Td2 to the signal at the junction Nb1 to generate the wave C2 at the junction Nb2. The process is repeated until the furthest left buffer 42 in FIG. 3 outputs the wave C9 at the junction Nb9 which is the pulse 46B. As illustrated in FIG. 2, when the pulses 46A, 46B are synchronized and locked, the phase difference between the waves C0 and C9 is actually one period T0 (or a period multiplied by an integer) of the wave C0. At this instant the rising and falling edge of the waves C0, C9 have no phase difference. The voltage control oscillator 20 in FIG. 1 unavoidably generates a predetermined phase difference in the waves C1 to C9 which is evenly distributed over the 360 degrees of the period T0 when the delay-locked loop 40 locks and synchronizes 46A, 46B at the junction Nb1 to Nb9.

The phase-locked loop and delay-locked loop shown in FIG. 1 and FIG. 3 are common building blocks for operating pulse but the conventional apparatus cannot sufficiently handle the wide application and contemporaneous requirement of the pulse requirement. Firstly in terms of the phase-locked loop as shown and described in FIG. 1, the phase-locked loop 10 generates a pulse 46B according to a pulse 24A and the relationship between them is defined by a multiplication factor: Fb=(Kb/Ka)Fa (which is the frequency of the pulses 24A, 24B). Theoretically speaking, adjusting the divide ratio 1/Ka or 1/Kb of the dividers 18A, 18B can generate the pulse 24B having different frequencies according to the pulse 24A. However in real application, the divide ratio affects the stability of the phase-locked loop so randomly interfering the divide ratio of the dividers 18A, 18B will cause the phase-locked loop 10 to become unstable. The divider 18B is especially affected because it is located in the feedback path of the phase-locked loop 10 which more easily affects the stability of the phase-locked loop 10. Different electronic circuits and different operational needs require different phase-locked loop having frequency multipliers (i.e. the above Kb/Ka). From the perspective of the IC designer, it is ideal that a design of a phase-locked loop being widely applicable to various electronic circuits by merely adjusting the divide ratio of the divider to create a phase-locked loop having different frequency multiplications. Apparently as mentioned, performing any random adjustment to the divide ratio of the dividers will cause instability of the phase-locked loop so the exact phase difference of two pulses cannot be obtained and the phase-locked loop fails. The conventional structure in FIG. 1 cannot be realistically made into a phase-locked loop having difference frequency multiplications because all other components such as the charge pump 14, the low pass filter 16, and the voltage control oscillator 20, have to be correspondingly changed besides changing the divide ratio of the divider to prevent instability from happening. In other words, the fundamental structure of the conventional phase-locked loop 10 lacks the flexibility and margin in design. In order to achieve a phase-locked loop with different frequency multiplication in different electronic circuits, other circuits in the phase-locked loop 10 along with the divide ratio and the divider have to be changed altogether. As a result, in order to adapt the conventional phase-locked loop, a lot of time and effort is required for redesigning, modeling, laying out, manufacturing, and the like which increase the time and cost in the manufacturing and design of electronic circuits.

Furthermore the delay-locked loop 30 in FIG. 3 does not have any frequency multiplication feature which can only maintain the synchronization of the pulses 46A, 46B without phase difference and cannot generate a pulse having difference frequency multiplication according to the pulse 46A. Therefore the pulse operation is limited.

SUMMARY OF INVENTION

It is therefore a primary objective of the claimed invention to provide a circuit and a method for generating frequency multiplication of a pulse that is in synchronization to another pulse in a phase-locked loop or delay-locked loop structure to solve the above-mentioned problem. The frequency multiplication circuit of the present invention increases flexibility and margin in the design of the phase-locked loop so the same phase-locked loop circuit design can be broadly applied to different frequency multiplication ratio. The frequency multiplication circuit of the present invention can increase the pulse operability of the delay-locked loop circuit to broaden the application level of the delay-locked loop.

Conventional phase-locked loops can generate a pulse according to another pulse and allow a specific frequency multiplication ratio but in order to actually generate frequency multiplication ratio changes to the divide ratio, the divider, and other related circuits must be made which restricts flexibility in circuit design. Furthermore conventional phase-locked loops can only lock a pulse to another pulse without phase difference which limits the operability of pulse.

In the present invention, the pulse after frequency multiplication is generated according to a pulse by the multiple phase pulse from the phase-locked loop and the delay-locked loop to achieve a frequency multiplication effect. In the phase-locked loop and the delay-locked loop circuits, the voltage control oscillator and the voltage control delay line generate a plurality of pulses having the same frequency but different phases during operation. The present invention uses the phase difference of the pulses to output frequency multiplication pulses. The present invention uses a plurality of pulses having the same frequency but different phases to generate a plurality of reference pulses having the same frequency but different phases. Within these reference pulses, if the number of pulses at level high signals is more than the number of pulses at level low signals a first level signal will be outputted. Oppositely if the number of pulses at level high signals is less than the number of pulses at level low signals a second level signal will be outputted. In this manner, the frequency of the outputted pulses is the frequency multiplication of the plurality of the pulses having the same frequency but different phases.

According to the claimed invention, the frequency multiplication circuit and method of the present invention allow the output of the phase-locked loop to perform frequency multiplication again. The effect of frequency multiplication is achieved without the need to change (or even to perform minor correction to) the divider and the divide ratio of the phase-locked loop which significantly increases the flexibility and margin in the design of the phase-locked loop circuit. A single phase-locked loop design can sufficiently accommodate different frequency multiplication ratios so to reduce the cost in redesigning, manufacturing, and raw material costing of the circuit. Furthermore the present invention is applicable to delay-locked loop which provides the frequency multiplication functionality on delay-locked loop which broaden the application in other circuits.

These and other objectives of the claimed invention will no doubt become obvious to those of ordinary skill in the art after reading the following detailed description of the preferred embodiment that is illustrated in the various figures and drawings.

DETAILED DESCRIPTION

Figure 4:
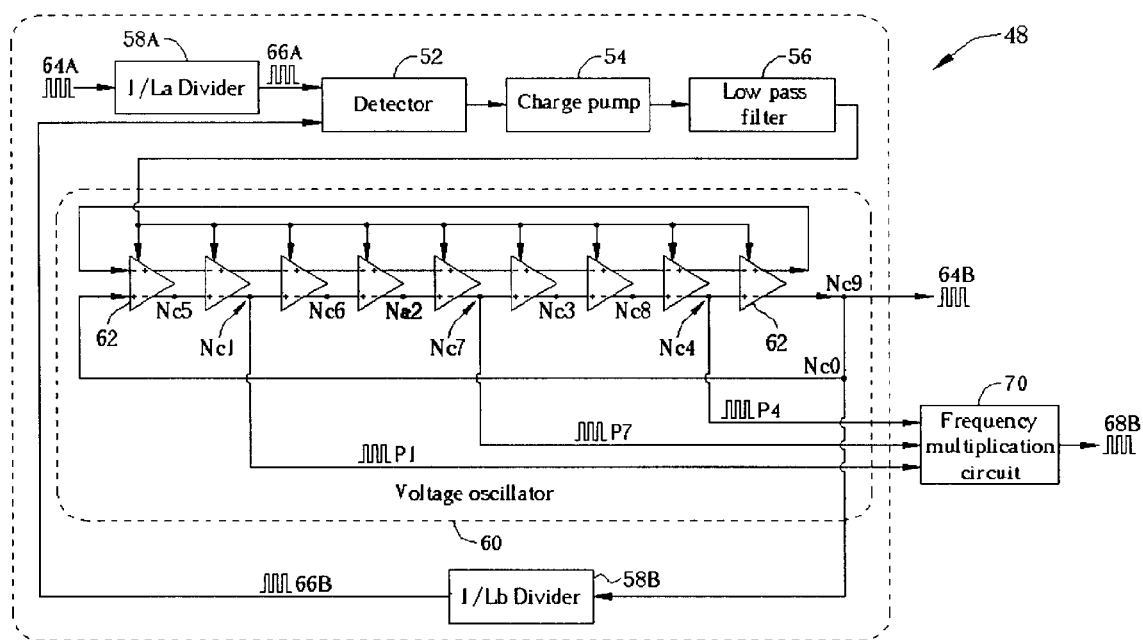
FIG. 4 is a block diagram of the frequency multiplication circuit and the phase-locked loop according to one embodiment of the present invention.

Please refer to FIG. 4 which is a schematic diagram of a frequency multiplication circuit 70 of a signal circuit 48 and a phase-locked loop 50 under operation together. Similar to the phase-locked loop 10 in FIG. 1, the phase-locked loop 50 comprises a detector 52 that detects the frequency and phase difference of the pulses 66A, 66B and transforms the detection results into voltage signals for a charge pump 54 and a low pass filter 56. The voltage control oscillator 60 according to the frequency and phase of the pulse 64B and the 1/La and 1/Lb dividers 58A, 58B divides the frequency of the pulses 64A, 64B into pulses 66A, 66B according to the voltage signal. The operation of the phase-locked loop 50 is identical to the phase-locked loop 10 in FIG. 1. After the phase-locked loop 50 finishes phase locking, the pulses 66A, 66B are synchronized without phase difference and generate the pulse 64B having the frequency multiplication Fb=(Lb/La)Fa according to the frequency multiplication Fa of the pulse 64A. The frequency multiplication 70 uses the voltage control oscillator 60 to generate an output signal 68B having a frequency which is an integer multiplier of that of the pulse 64B at each junction. The frequency multiplication circuit 70 of the present invention causes the frequency Fc of the output signal 68B to be equal to the frequency Fb of the pulse 64B multiplied by an integer multiplier Lc, i.e. Fc=Lc*Fb. The phase-locked loop 50 introduces the frequency multiplication ratio Lb/La so therefore the relationship between the output signal 68B and the pulse 64A is defined by Fc=Lc(Lb/La)*Fa. In other words, the frequency multiplication circuit 70 of the present invention allows the signal circuit 48 to generate the output signal 68B having a frequency multiplication factor of Lc*Lb/La according to the pulse 64A.

Figure 1:
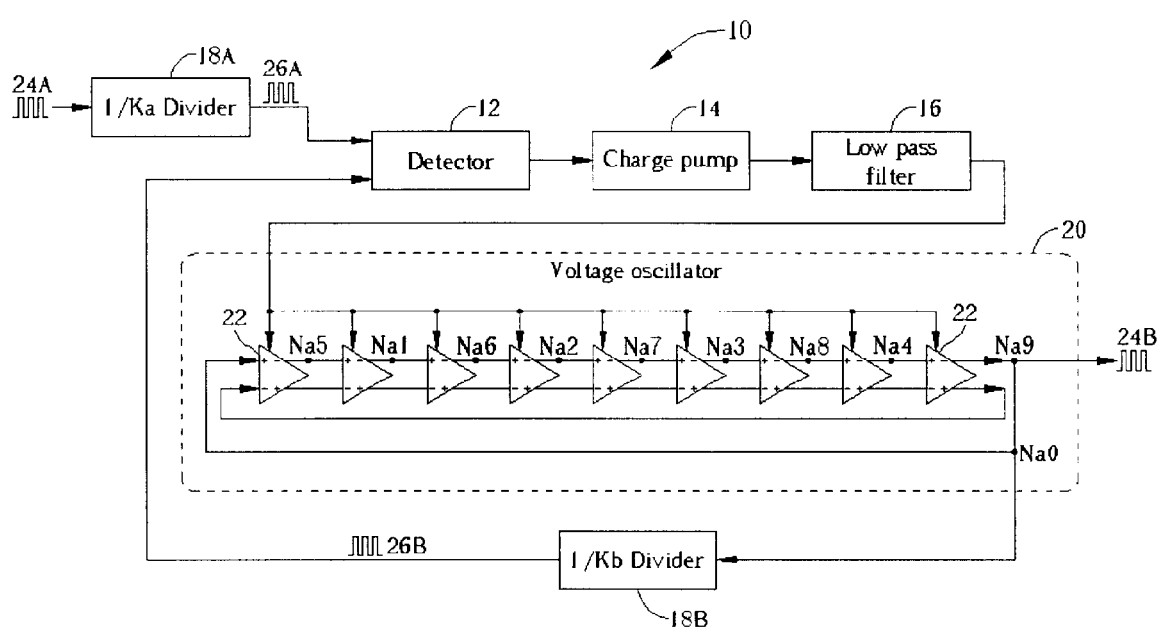
FIG. 1 is a block diagram of a conventional phase-locked loop according to prior art.
Figure 5:
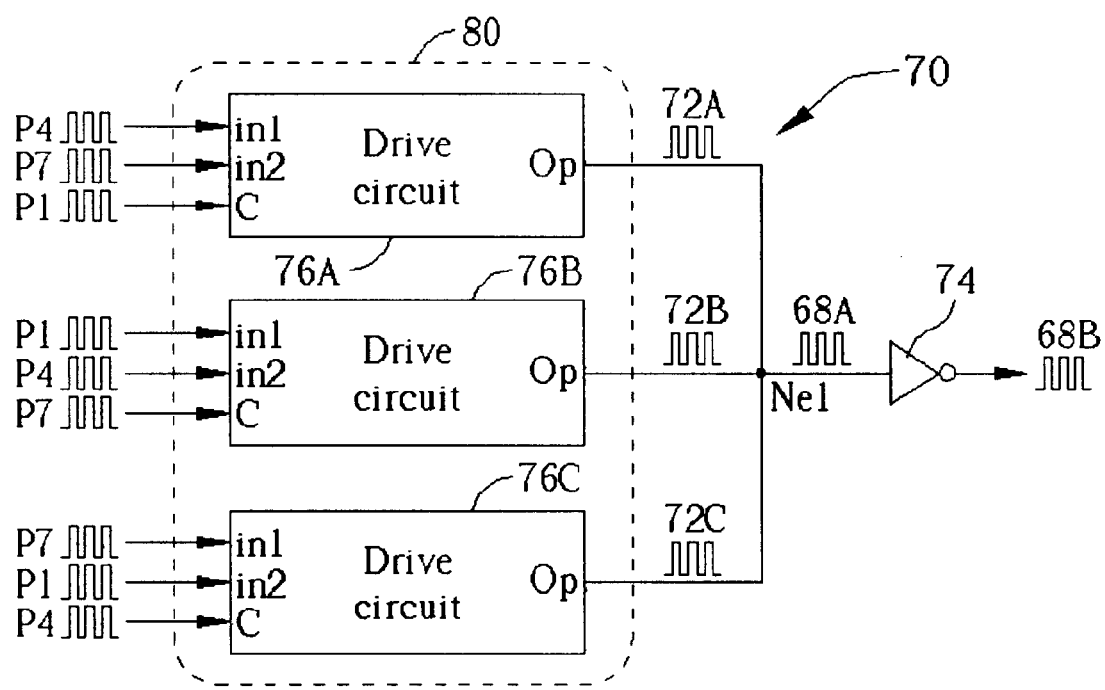
FIG. 5 is a block diagram of the frequency multiplication circuit in FIG. 4 according to one embodiment of the present invention.

The embodiment in FIG. 4 is similar to the embodiment in FIG. 1. The voltage control oscillator 60 is constructed from coupling nine differential buffers 62 in series. The voltage control oscillator 60 takes the signal at every junction as the input signal for the frequency multiplication circuit 70 to generate a frequency multiplication output signal 68B. In the embodiment in FIG. 4, the frequency multiplication 70 uses the voltage control oscillator 60 to receive the input signals P1, P4, and P7 at the junctions Nc1, Nc4, and Nc7 and generates the output signal 68B (i.e. Lc=3) that is three times the frequency of the pulse 64B. In order to better describe the frequency multiplication circuit 70 in this embodiment of the present invention, please refer to FIGS. 5 and 6 (and simultaneously to FIG. 4). FIG. 5 is a schematic diagram of the function blocks of the frequency multiplication circuit 70. The frequency multiplication circuit 70 comprises a drive module 80 and an inverter 74, wherein the drive module 80 comprises a plurality of drive circuits 76A to 76C. The structure of all the drive circuits 76A to 76C is identical so only the drive circuit 76A is used as an example in FIG. 6 to illustrate one embodiment of the schematic circuit of the drive circuit.

In FIG. 5, the drive module 80 of the frequency multiplication circuit 70 comprises three drive circuits 76A to 76C in order to provide a three times frequency multiplication function, wherein each drive circuit comprises two input terminals in1, in2, a control terminal C, and an output terminal 0p. The output terminal 0p of the drive circuits is electrically connected to the junction Ne1 that becomes the output terminal of the drive module 80 and provides the inverter 74 with an output signal 68A. Finally, the output of the inverter 74 becomes the output signal 68B of the frequency multiplication circuit 70. As shown in FIG. 5, there are three same frequency but different phase signals P1, P4, and P7 which are combined to generate the three times frequency multiplication function of the frequency multiplication circuit 70. The drive circuits 76A to 76C of the drive module 80 separately input the signals P1, P4, P7 into the control terminal C and the input terminals in1, in2. For drive circuit 76A, the signals P4, P7 are inputted into the two terminals in1, in2 respectively. Under the control and trigger of the signals P1, P4, P7, the drive circuits 76A, 76B, 76C will independently charge the output terminal 0p which are represented by the reference signals 72A, 72B, 72C form the output terminal 0p.

Figure 6:
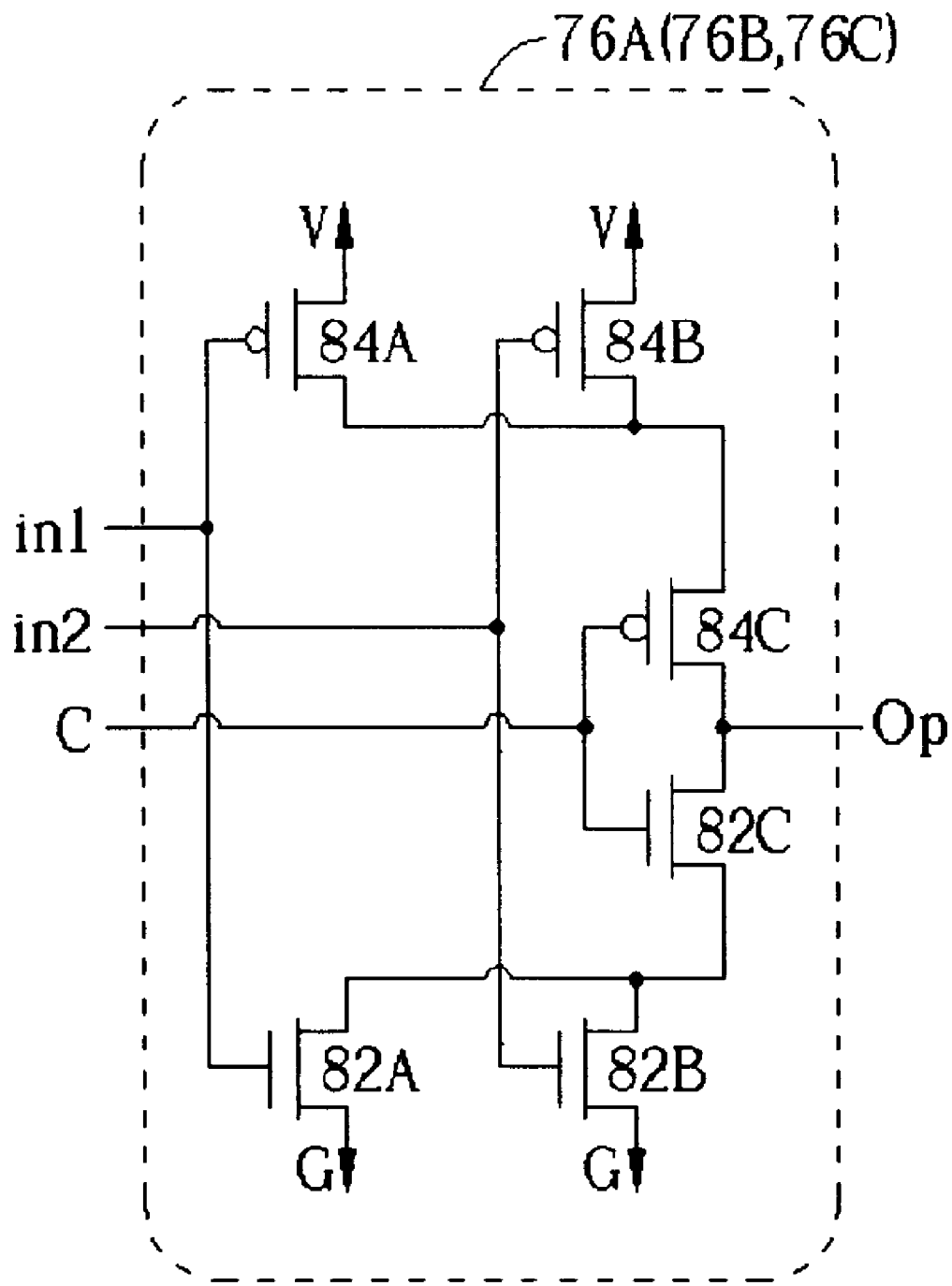
FIG. 6 is a circuit diagram of the drive circuit in FIG. 5 according to one embodiment of the present invention.

Following FIG. 6 shows the circuit layout of the drive circuit 76A as an explanation of the other drive circuits. In order to match the control terminal C of the drive circuits in FIG. 5, the drive circuit 76A comprises a p-type metal-oxide semi-conductor 84C, a n-type metal-oxide semiconductor 82C, two gates electrically connected to the control terminal C, and two drains electrically connected to the output terminal 0p. The drive circuit 76A comprises p-type metal-oxide semi-conductors 84A, 84B and n-type metal-oxide semi-conductors 82A, 82B to pair with the two input terminals in1, in2. The gate of the semiconductors 82A, 84A is electrically connected to the input terminal in1 and the source of the two semi-conductors are respectively latched to the DC G and the DC V at the ground. The input terminal in2 is electrically connected to gate of the semi-conductors 82B, 84B and the source of the two semi-conductors is respectively latched to the DC G and the DC V at the ground.

Figure 2:
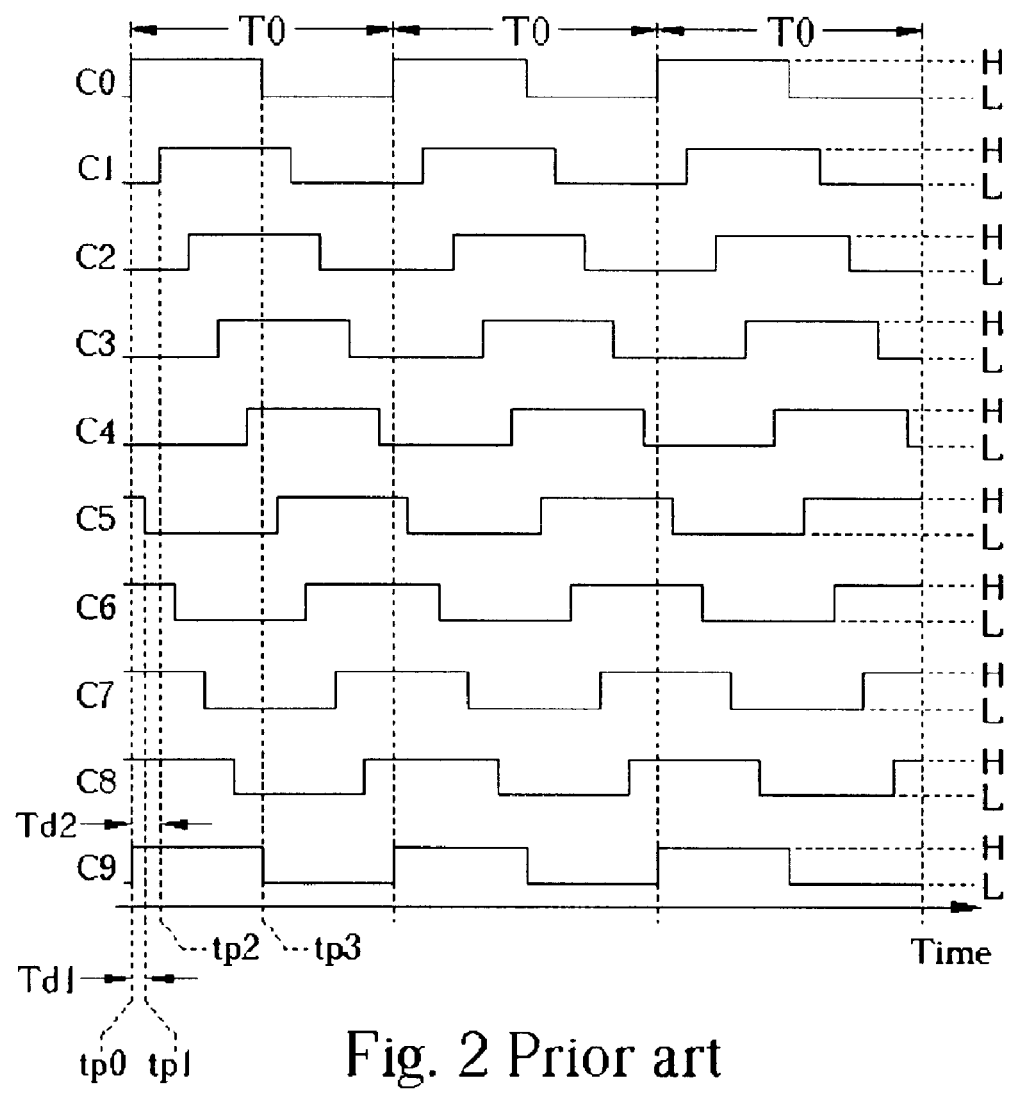
FIG. 2 is a schematic diagram showing the pulse at each junction during operation of the voltage oscillator in FIG. 1.
Figure 7:
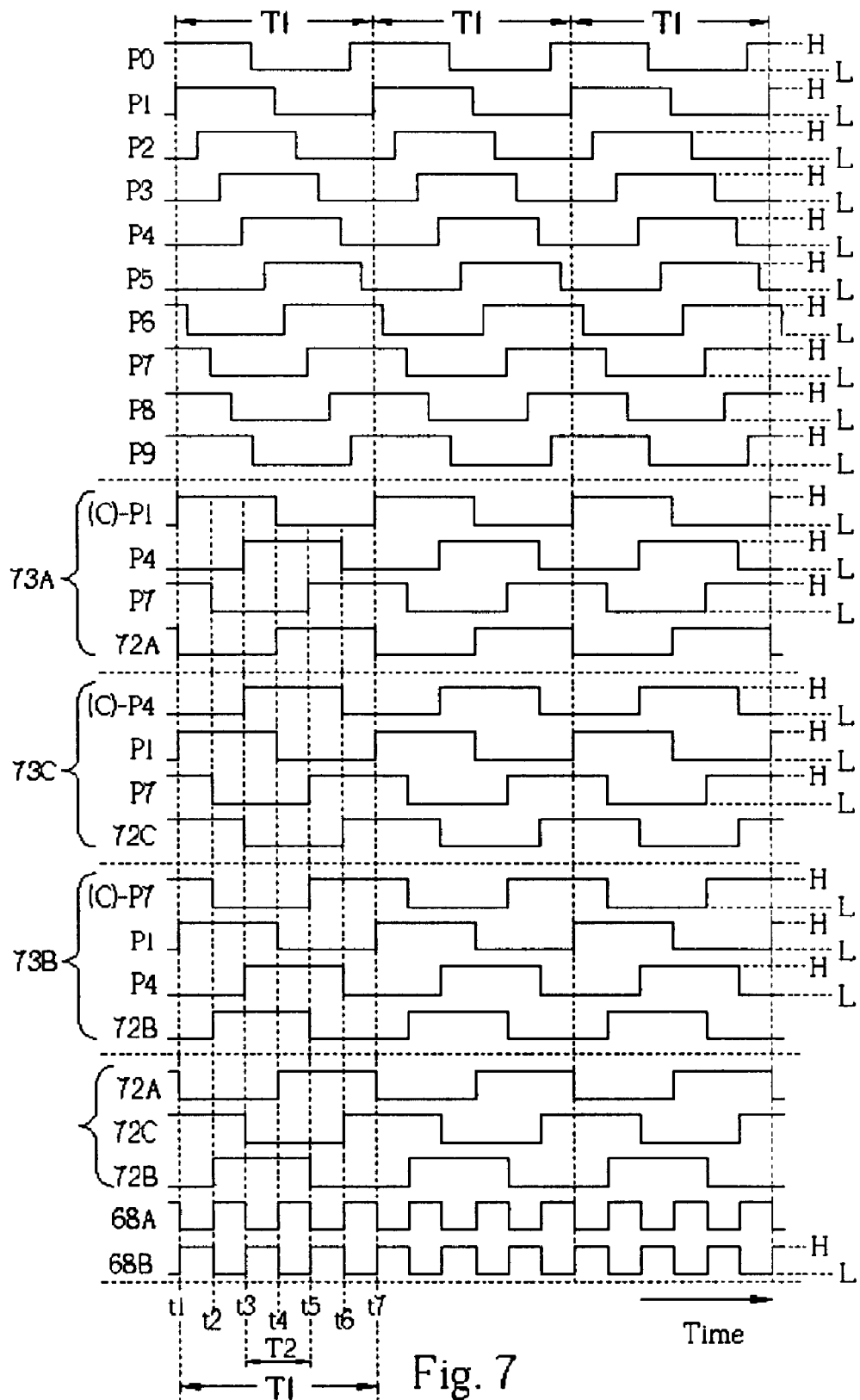
FIG. 7 is a graph showing the wave pulse of the signals during the operation of the circuit according to FIG. 4 of the present invention.

Please refer to FIG. 7 (simultaneously with FIGS. 4, 5, and 6) for the description of the operation of the frequency multiplication circuit 70. FIG. 7 is a schematic diagram of the wave pulses of the signals of the voltage control oscillator 60 and the frequency multiplication circuit 70 during operation. In FIG. 7, the signals P0, P1, P2, to P9 are the signals (the signal P9 is the same as the signal P0 which is the pulse 64B, please refer to FIG. 4) of the voltage control oscillator 60 in FIG. 4 at the junctions Nc0, Nc1, Nc2, to Nc9. As shown in FIGS. 1 and 2 and the descriptions, the voltage control oscillator 60 comprises nine differential buffers 62 and the signals P1 to P9 all have the same period T1 but are separated by a phase difference within 360 degrees. The signals P1 and P2 have a 40-degree (360/9) phase difference. From the above deduction, the signals P0 to P9 oscillate between the signal level high and the signal level low that can be seen as the preliminary signals generated by the voltage control oscillator 60. In the embodiment in FIG. 4, three signals P1, P4, and P7 are selected from the signals P1 to P9 to be the input signals for the frequency multiplication circuit 70 to accomplish the three times frequency multiplication. Please take note that the phase difference the signals P1, P4, and P7 is approximately within 360 degrees, the phase difference between the signal P1, P4, is 120 degrees and the difference between the signals, P4, P7 is also 120 degrees.

As illustrated in FIG. 5, each of the control terminal C to the three drive circuits 76A to 76C in the drive module 80 individually receives either the signals P1, P4, or P7 as the control signals and the input terminals in1, in2 receive the rest of the two signals as trigger signals. Each drive circuit 76A to 76C determines the discharging or charging of the output terminal 0p, which is respectively represented by the 72A, 72B, and 72C. For example, in FIG. 7, the reference signal 72A of the wave imposition 73A represents (the signal P1 labeled in front of (C) meaning the signal P1 is a control signal of the control terminal C) discharging or charging of the output terminal 0p when the signal P1 is used as a control signal and the signal P4, P7 are used as trigger signals. Please refer to FIG. 7 to FIG. 6 and the time markers t0 to t4, the signal P1 of the control terminal C of the drive circuit remains at the level high (like the level of the DC V). The semi-conductors 82B is conductive while the semi-conductor 84C remains off so the voltage of the output terminal 0p depends on the open or close state of the semi-conductors 82A, 82B. In the meanwhile, the signal P7 first remains at level high H at the times t0 and t2 so the semi-conductor 82B is conductive allowing the output terminal 0p of the drive circuit 76A to discharge to the DC G of the ground. In FIG. 7, the reference signal 72A is at level low L at times t1 to t2 so the drive circuit 76A will pull down the voltage of the output terminal 0p. Between time t2 and t3, the signals P4, P7 remain at level low L and the voltage of the output terminal 0p does not change and the reference signal 72A remains at level low L. Then between time t3 and t4, the level high L of the signal P4 allows the semi-conductor 82A to be conductive. In FIG. 7, the reference signal 72A remains at level low L so the drive circuit 76A keeps the voltage of the output terminal 0 to the DC G of the ground.

Oppositely between t4 and t7, the signal P1 being a control signal becomes level low H so the semi-conductors 84C, 82C switch off. At this time, the voltage of the output terminal 0p is controlled by the semi-conductors 84A, 84B. Between t4 and t5, the level low L of the signal P7 renders the semi-conductor 84B conductive. The reference signal 72A remains at level high H so the drive circuit 76A pulls the voltage of the output terminal 0p to the DC V level. Between time t5 and t6, the signals P4, P7 at level high H switch off the semi-conductor 84A, 84B and the voltage of the output terminal 0p remains unchanged. Finally between time t6 and t7, the signal P4 at level low L renders the semi-conductor 84A conductive and the reference signal 72A remains at level high H so the drive circuit 76A charges the voltage of the output terminal 0p to the DC V.

Similarly the wave imposition 73A indicates that the signal P4 at the control terminal C controls the drive circuit 76C. The reference signal 72C is at level high H at times t1, t3, t6 to t7 and the drive circuit 76C charges the voltage of the output terminal 0p to the level high of the DC V. The reference signal 72C is at level low at times t3 to t6 which represents that the drive circuit 76B discharges the voltage of the output terminal 0p to level low of the DC G of the ground. From the wave imposition 73B that corresponds to the drive circuit 76B, the drive circuit 76B charges the voltage of the output terminal 0p to the level high of the DC V at times t2 to t5 (the reference signal 72C indicates a level high), and then discharges the voltage of the output terminal 0p to the level low of the DC G at times t1 to t2, and t5 to t7 (the reference signal 72B indicates a level low). From each reference signal 72A to 72C, the phase difference of the signals P1, P4, and P7 causes the drive circuits 73A to 73C to trigger the charge and discharge operations at different moments within the same time period.

The output terminal 0p of all the drive circuits 76A to 76C is electrically connected to the junction Ne1 (please refer to FIG. 5) so the charging and discharging of the output terminal 0p of each drive circuit 76A to 76C determines the voltage of the junction Ne1. As FIG. 7 illustrates, by looking at all the reference signals 72A to 72C, it is determined that two drive circuits (drive circuit 76A, 76B) discharge the voltage of the junction Ne1 to the level low of the DC G and only one drive circuit (drive circuit 76C) charges the voltage of the junction Ne1 to the high level of the DC V. Within this time period, the signal 68A sent to the inverter 74 approaches the level low and trigger the inverter 74 to output a signal 68B having level high (please refer to FIG. 5 at the same time). Oppositely, between times t2 to t3, the drive circuits 76B, 76C charge the voltage of the junction Ne1 to level high of the DC but the drive circuit 76A discharges the voltage of the junction Ne1 but the voltage of the junction Ne1 still rises to the level high of the DC V and triggers the inverter 74 to output a signal 68B having level low L.

By the same theory, during the period T1 between t1 to t7, the two drive circuits charge the voltage of the junction Ne1 to level high of the DC V at times t4, t5, t6, and t7 so the inverter 74 outputs a level low L signal 68B. Then at times t3, t4, t5, and t6, the two drive circuits discharge the voltage of the junction Ne1 to the DC G so the inverter 74 outputs a pulled-up level high H signal 68B. From the waves of the output signals 68A, 68B in FIG. 7, the period T2 of the output signals 68A, 68B is ⅓ of the period T1. In other words, the signals P0 to P9 at different junctions in the voltage control oscillator 60 and the charging and discharging of the drive circuits 76A to 76C according to the reference signals 72A to 72C are all variations of the fundamental period T1. The present invention combines the phase difference of all the signals after each drive circuit 76A to 76C completes charging and discharging to achieve the output signal 68B having three time multiplication of the period T1 by the frequency multiplication circuit 70.

As shown in FIG. 4 and previously described, the frequency multiplication circuit 70 of the present invention can additionally accept a multiplication ratio Lc to compliment the original frequency of the phase-locked loop 50 so the frequency of the output signal 68B is Lc*(Lb/La) times the frequency of the pulse 64A. FIG. 4 to FIG. 7 shows the embodiments of the present invention where the frequency multiplication circuit 70 additionally undertake a three times multiplication ratio (Lc=3). Consequently the frequency multiplication 70 of the present invention can undertake an additional frequency multiplication ratio when various electronic circuits requiring pulse operation circuits having different frequency multiplication are implemented. The phase-locked loop and the divider of the present invention do not have to be altered and the pulse operation having different frequencies is achieved. In the prior art, the change in the divide frequency of the divider of the phase-locked loop to accomplish different frequency ratio results in instability in the operation of the divider circuit. In contrast the present invention can achieve difference frequency ratios in electronic circuits by introducing a multiplication ratio without the need to alter the divide ratio of the dividers. The frequency multiplication circuit of the present invention does not reside inside the closed loop of the phase-locked loop and therefore will not significantly affect the stability of the phase-locked loop. As a result the same phase-locked loop can be realistically generate different frequency ratios without the burden of redesigning the other circuits of the phase-locked loop from changing the divide ratio of the divider. Although under some special circumstances there might still be a possibility that an adjustment of the divide ratio of the divider is required to realistically achieve the frequency multiplication ratio but the magnitude of the change in the divide ratio of the divider is much smaller in the present invention. The present invention can maintain a desirable stability of the operation of the phase-locked loop without redesigning the other circuits of the phase-locked loop. In other words, the frequency multiplication circuit of the present invention increases the flexibility and the margin on the design of phase-locked loop.

Figure 8:
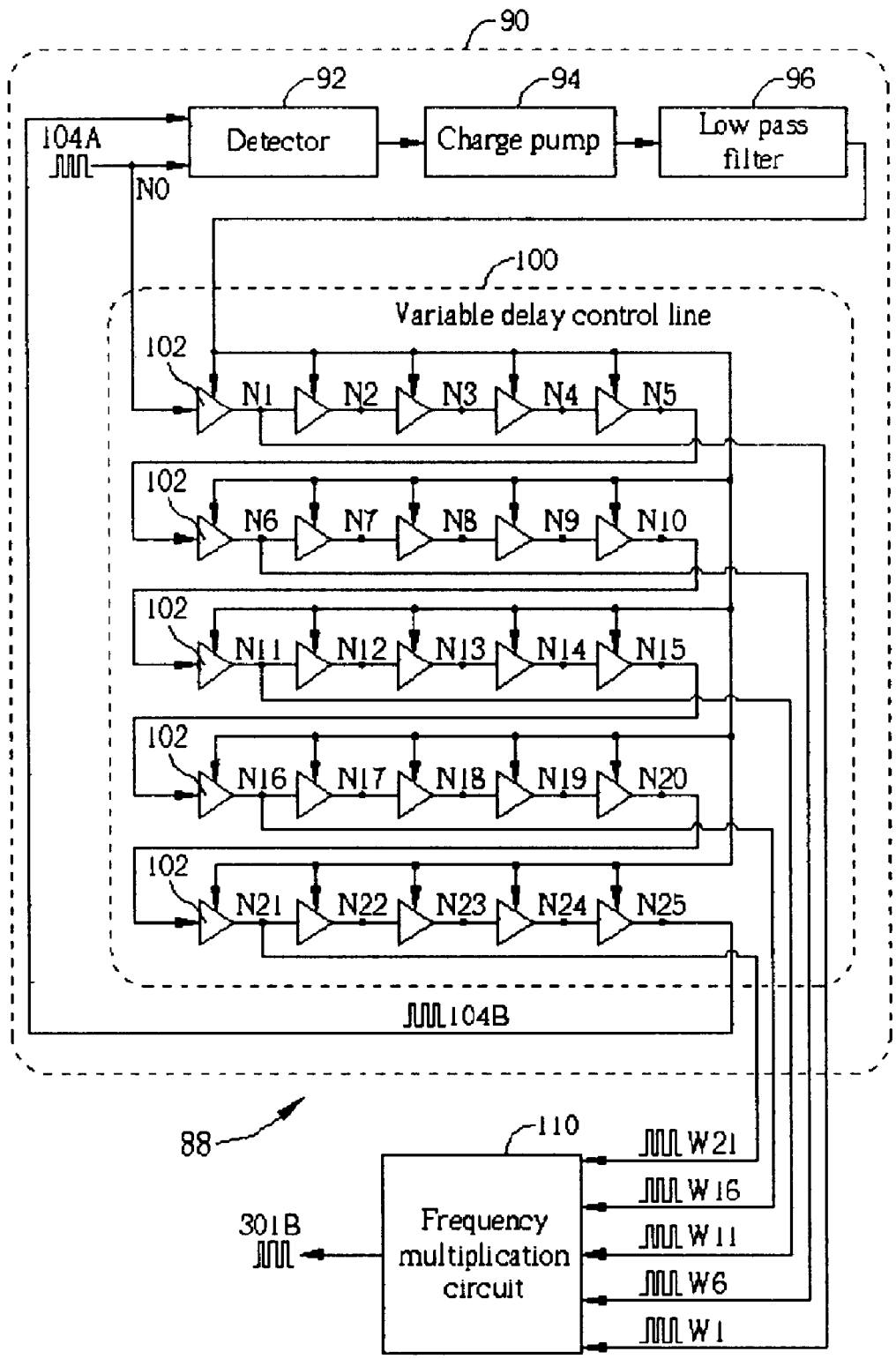
FIG. 8 is a block diagram of the frequency multiplication circuit and a delay phase-locked loop according to another embodiment of the present invention.

Besides the application on phase-locked loop, the present invention is also applicable to delay-locked loop providing frequency multiplication results. Please refer to FIG. 8 which shows a schematic block diagram of operation of the frequency multiplication circuit 110 and the delay-locked loop 90 in a communication circuit 88. The delay-locked loop 90 in FIG. 8, resembling the conventional delay-locked loop in FIG. 3, comprises a detector 92 for detecting the phase difference of the pulses 104A, 104B and the detector 92 transforms the detection results into voltage and sends to the charge pump 94, the low pass filter 96, and the variable control delay line when the pulse 104B is adjusted according to the voltage. After the delay-locked loop 90 completes the phase lock, the frequency and step of the pulses 104A, 104B are in synchronization with any phase difference (or effective difference where it is an exact multiplication of the 360 degrees). In the embodiment of FIG. 8, the variable control delay line 100 comprises 25 buffers 102, wherein each buffer has inputs and output sequentially coupled at the junctions N0 to N25. Each buffer can adjust the timing of the pulse 104B according to the time difference between the input and the output signal upon receive of the voltage signal from the low pass filter 96. The present invention can realistically achieve the five times frequency multiplication by the frequency multiplication circuit 110 by summing the signals of the 25 buffers 102. In other words, the output signal 310B generated by the frequency multiplication 110 is five times that of the signal 104A, 104B.

Figure 9:
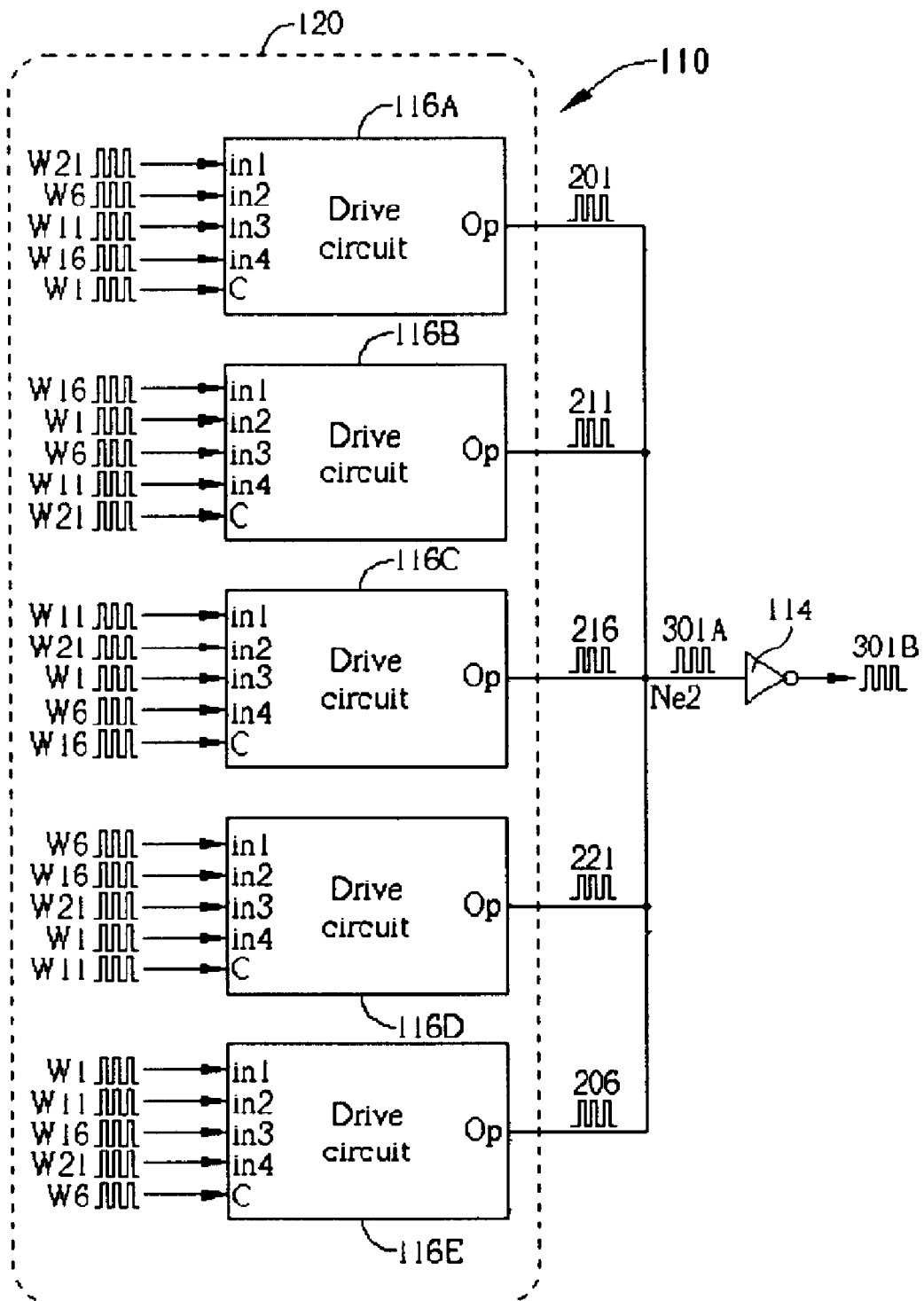
FIG. 9 is a block diagram of the frequency multiplication-circuit in FIG. 8 of the present invention.
Figure 10:
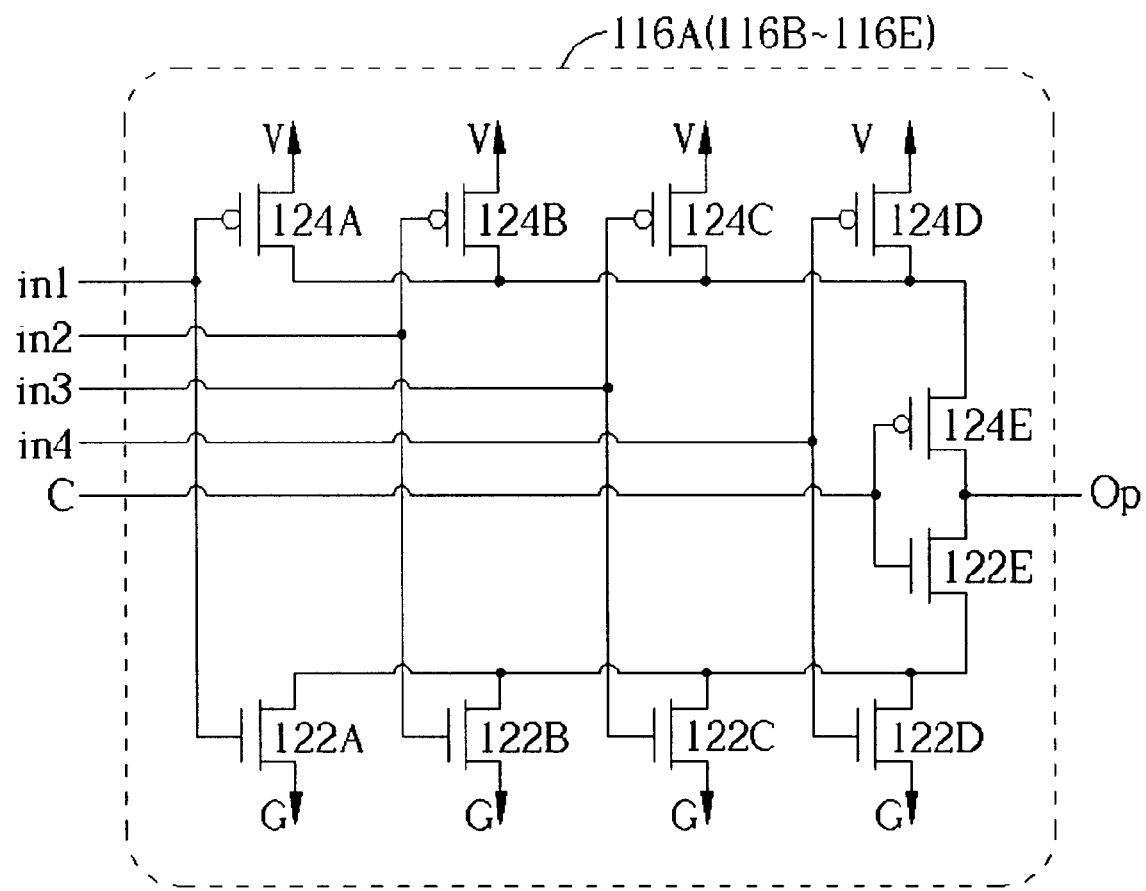
FIG. 10 is a schematic diagram showing the circuit layout of the rive circuit in FIG. 9.

As illustrated in FIG. 8 and the corresponding embodiment, the frequency multiplication circuit 110 achieves frequency multiplication by the variable control delay line 100 from the five signals W1, W6, W11, W16, and W21 at the junctions N1, N6, N11, N16, and N21 respectively. Please continue to refer to FIGS. 9 and 10, FIG. 9 is a schematic block diagram of the frequency multiplication circuit 110. The frequency multiplication circuit 110 comprises a drive module 120 and an inverter 114. The drive module 120 further comprises five drive circuits 116A to 116E to match the input signals W1, W21, W16, W11, and W6. The drive circuits 116A to 116E further comprise four input terminals in1 to in4, a control terminal, and an output terminal 0p. The structure and design of the following drive circuits 116A to 116E are the same so only the drive circuit 116 is being used as an example and is illustrated in FIG. 10.

Please refer to FIG. 9, the control terminal C of the drive circuits 116A to 116E receives the signals W1, W21, W16, W11, W6 as the control signal and the input terminals in1 to in4 receive other 4 signals as the trigger signal. The output terminal of the drive circuits 116A to 116E is all coupled to the junction Ne2. According to the trigger signal and the control signal, the reference signals 201, 211, 216, 221, 206 at the output terminal 0p of the drive circuits 116A to 116E indicate the discharging or charging at the junction Ne2. The output signal 301A is a combination of all the discharging or charging of the drive circuits 116A to 116E at the junction Ne2 that triggers the inverter 114 to generate an output signal 301A. As FIG. 10 illustrates, the drive circuits 116A to 116B comprise five p-type semi-conductors 124A to 124E and five n-type semi-conductors 122A to 122E, wherein the gate of each semi-conductor 122A to 122E and 124A to 124E is controlled by the inputs from the input terminals in1 to in4 and the control terminal C. The drain of the semiconductors 122E to 124E forms the output terminal 0p of the drive circuits.

Figure 11:
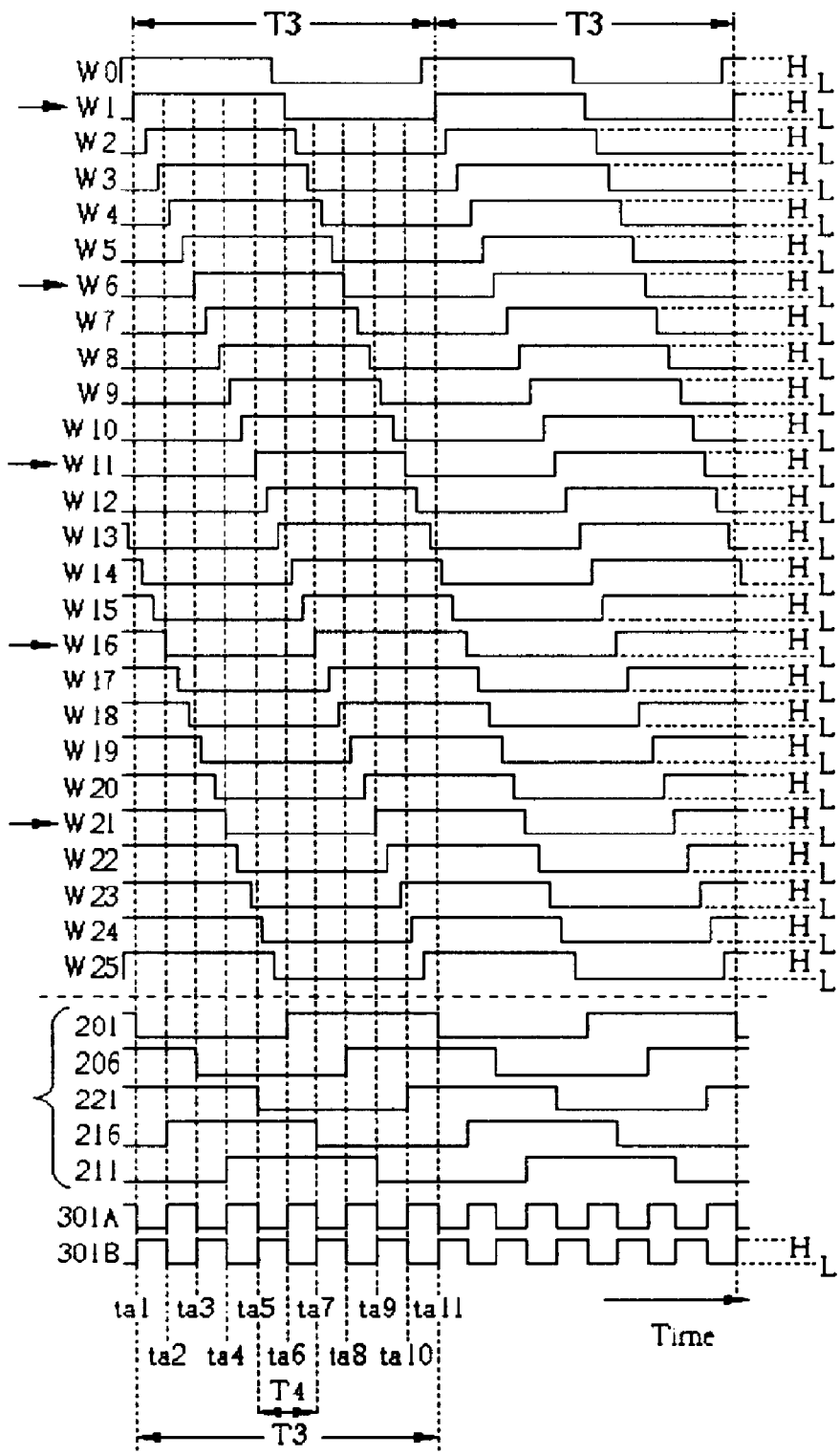
FIG. 11 is a graph showing the wave pulse of the signals during the operation of the circuit according to FIG. 8 of the present invention.

Please refer to FIG. 11 (simultaneously refer to FIG. 8 to 10) which represents the theory in achieving five times frequency multiplication by the frequency multiplication circuit 110. FIG. 11 is a schematic diagram of the wave pulse of each related signal during the operation of the frequency multiplication circuit 110. The horizontal axis of the graph is time and the vertical axis represents the magnitude of the signal. The signals W0 to W25 are signals controlled by the variable control delay line 100 at the junctions N0 to N25. After the delay-locked loop 90 completes locking, the signal W25 at the junction N25 (that is the pulse 104B) is automatically synchronized with the signal N0 at the junction N0 (that is the pulse 104A) with the same timing and frequency (having a period T3) and no phase difference. The signals W1 to W25 can be used as the preliminary signals, and in the embodiment shown in FIG. 8 the signals W1, W6, W11, W16, W21 having a phase difference evenly distributed within 360 degrees are chosen from the preliminary signals to achieve the frequency multiplication of the frequency multiplication circuit 110. From FIG. 10, the operation theory of the drive circuit 116A is identical to that of the drive circuit 76A in FIG. 6. For example, in the drive circuit 116A as illustrated in FIG. 11, the signal W1 being a control signal is at high level H between time ta1 and ta6 causing the semi-conductor 122E to be electrically connected and the semi-conductor 124E to be closed. Within the same period, the signals W6, W11, W16, W21 being the trigger signals inputted to the input terminals in2, in3, in4, in1 become level high H to create electrical connection for the semi-conductors 122A to 122D from time ta3 to ta6, ta5 to ta6, ta1 to ta2, ta1 to ta4 respectively. Between time ta1 to ta6, the drive circuit 116A discharge the voltage of the junction N2 to level low L of the DC G. Between time ta1 to ta6, the reference signal 201 of the output terminal 0p of the drive circuit 116A becomes level low H to demonstrate that the drive circuit 116A is discharging. Oppositely, between ta6 to ta11, the low level L signal will switch off the semi-conductor 124E and 122E. The signal W6, W11, W16, W21 being the trigger signals inputted to the input terminals in2, in3, in4, in1 pulls the voltage of the junction N2 to level high H of the DC V to create electrical connection for the semi-conductors 124A to 124D from time ta6 to ta8, ta6 to ta10, ta7 to ta11, ta9 to ta11 respectively. The reference signal is at high level during this period and the drive circuit 116A is charging the voltage at the junction Ne2.

Abiding the same principles, the discharging or charging of the junction Ne2 by the drive circuits 116B to 116E is indicated by the level of the reference signals 206, 211, 216, and 221. By analyzing the discharging and charging of the reference signals 201, 211, 216, 221, and 206 of the drive circuits 116A to 116E, the voltage level of the junction Ne2 and the curves of the output signals 301A, 301B are determined. For example, between ta1 to ta11 there is a time period T3, from time ta1 to ta2, ta3 to ta4, ta5 to ta6, ta7 to ta8, ta9 to ta10, three out of the five drive circuits of the drive circuits 116A to 116E discharge the voltage of the junction Ne2 and the rest of the two charge the voltage of the junction Ne2. At this time, the reference signal 310A from the junction Ne3 is at level low and the inverter 114 outputs a reference signal 301B. Oppositely, between time ta2 to ta3, ta4 to ta5, ta6 to ta7, ta8 to ta9, and ta10 to ta11, three out of the five drive circuits charge to pull up the voltage of the junction Ne2 but only two of rest discharge the voltage of the junction Ne2 to low, as a result the inverter 114 outputs a signal 301B that is at level low L. FIG. 11 clearly shows that the period of the signal 301B is T4 which is ⅕ of T3 so therefore the present invention successfully achieves a five times frequency multiplication by the frequency multiplication circuit 110.

From the above discussion, the frequency multiplication circuit of the present invention expands the pulse operation of the delay-locked loop when the frequency multiplication circuit and the delay-locked loop are paired up. The communication circuit 88 in FIG. 8 can generate a pulse 104B according to the pulse 104A that is synchronized in frequency, time, and has no phase difference and can generate an output signal 301B that has five times multiplication of the pulse 104A with the frequency multiplication circuit 100.

Figure 12:
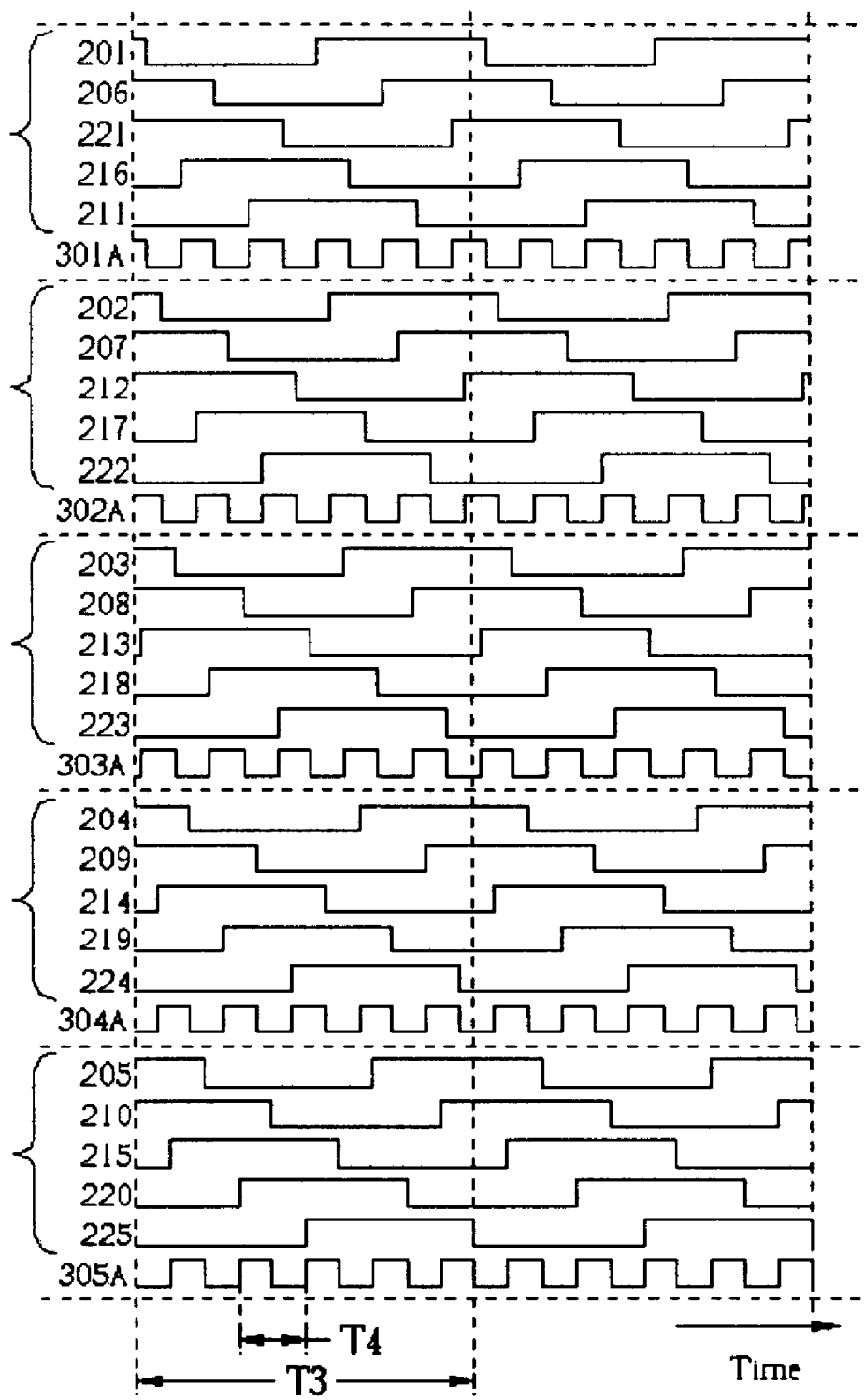
FIG. 12 is a graph showing the wave pulse of the signals during the operation of the circuit with different input signals performing frequency multiplication according to the present invention.

In the embodiment shown in FIGS. 8 and 9, the variable control delay line 100 relies on the signals W1, W6, W11, W16, and W21 at the junctions N1, N6, N11, N16, and N21 to achieve the five times frequency multiplication. Apparently any of the signals from W1 to W25 can be selected to achieve frequency multiplication in the present invention and it is not limited to the ones selected in the embodiments. In explanation of this, please refer to FIG. 12. FIG. 12 is schematic timing diagram showing the reference signals representing the discharging and charging and the output signal generated by the junction Ne2 when the frequency multiplication circuit 110 is given different input signals. When the frequency multiplication circuit 110 takes W1, W6, W11, W16, and W21 as the input signals, the reference signals 201, 206, 211, 216, and 221 can be used to represent the discharging and charging because the signals W1, W6, W11, W16, and W21 are as control signals at the control terminal C of the drive circuits 116A to 116E. Recognizing all the discharging and charging from all the drive circuits at the junction Ne2, the wave variation of the voltage of the junction Ne2 is represented by the output signal 301A, as illustrated in FIG. 8 to 11. Similarly the frequency multiplication circuit 110 changes to the input signals to W2, W7, W12, W17, and W22 to become the control signals for the drive circuits 116A to 116E. The reference signals 202, 207, 212, 217, and 222 represent the discharging and charging of the drive circuits at the junction Ne2. The combined effect of the wave voltage variation at the junction Ne2 is represented by the output signal 302A in FIG. 12.

Using the same deduction, the frequency multiplication circuit 110 uses the input signals (W3, W8, W13, W18, W23), (W4, W9, W14, W19, W24), and (W4, W9, W14, W19, W24) to control the control terminal C of the drive circuits 116A to 116E, whereby the discharging or charging of the junction Ne2 of the drive circuits 116A to 116E is represented by the reference signals (203, 208, 213, 218, 223), (204, 209, 214, 219, 224), and (204, 209, 214, 219, 224) and the wave voltage curve of the junction Ne2 is represented by the output signals 303A, 304A, and 305A. From FIG. 12, the frequency multiplication circuit 110 of the present invention only requires five input signals having a phase difference evenly distributed within 360 degrees to perform a fives times frequency multiplication. The output signals 301A to 305A in FIG. 12 shows that the period T4 of the output signals 301A to 305A is ⅕ of the period T3 of the delay-locked loop. Furthermore in FIG. 12, the use of five different input signals causes the output signals 301A to 305A to have phase differences and the phase difference between 301A to 305A is evenly distributed within the 360 degrees of the period T4. In other words, as long as the appropriate input signals is selected from the signals W1 to W5 for the frequency multiplication circuit 110, the frequency multiplication circuit 110 of the present invention can successfully generate an output signals having five times frequency multiplication and a specified phase. Apparently the frequency multiplication circuit 110 can comprise other drive modules incorporating different input signals to generate five times frequency multiplication outputs having unique phase differences.

Figure 13:
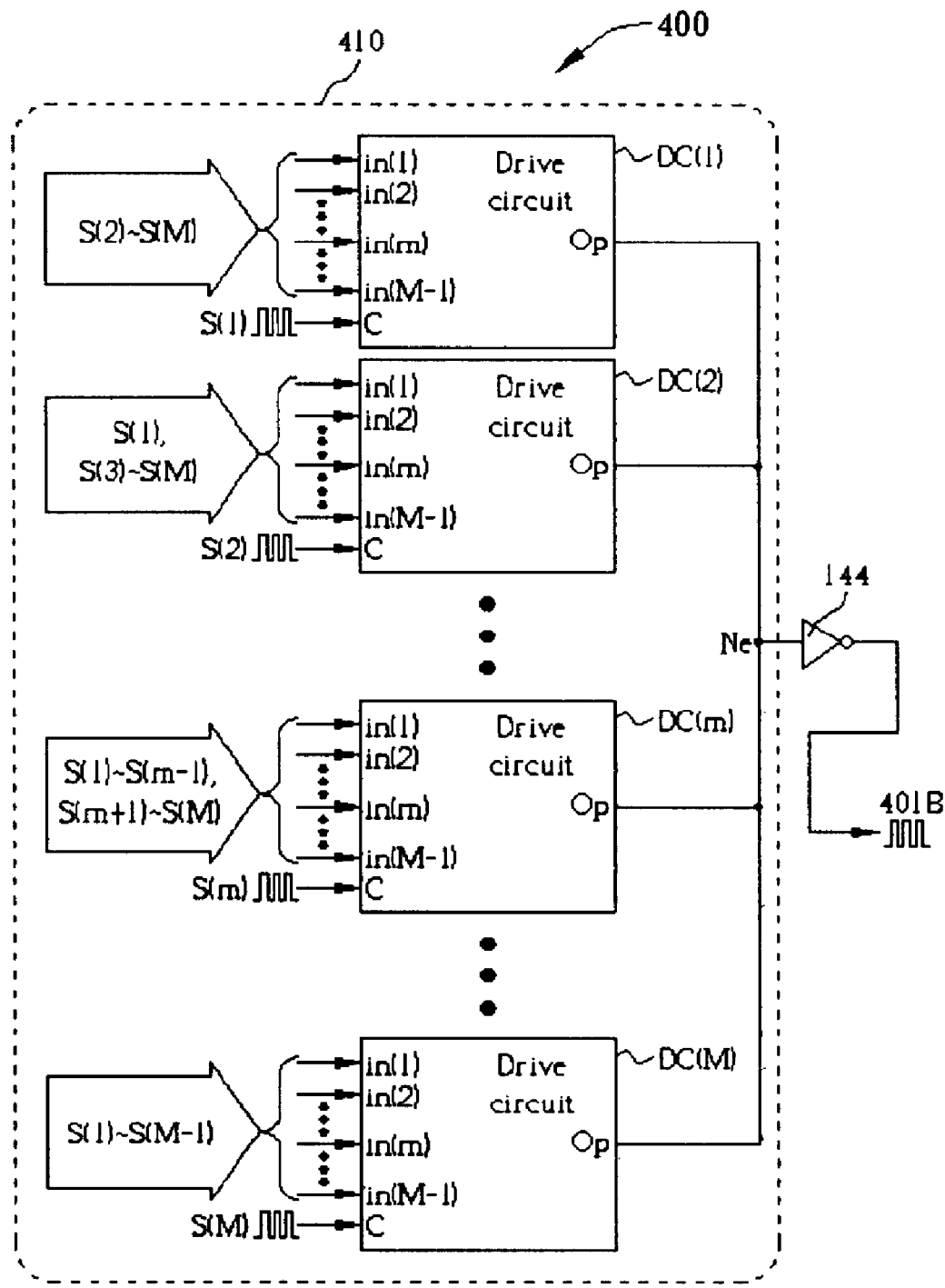
FIG. 13 is a block diagram of the frequency multiplication circuit according to another embodiment of the present invention.
Figure 14:
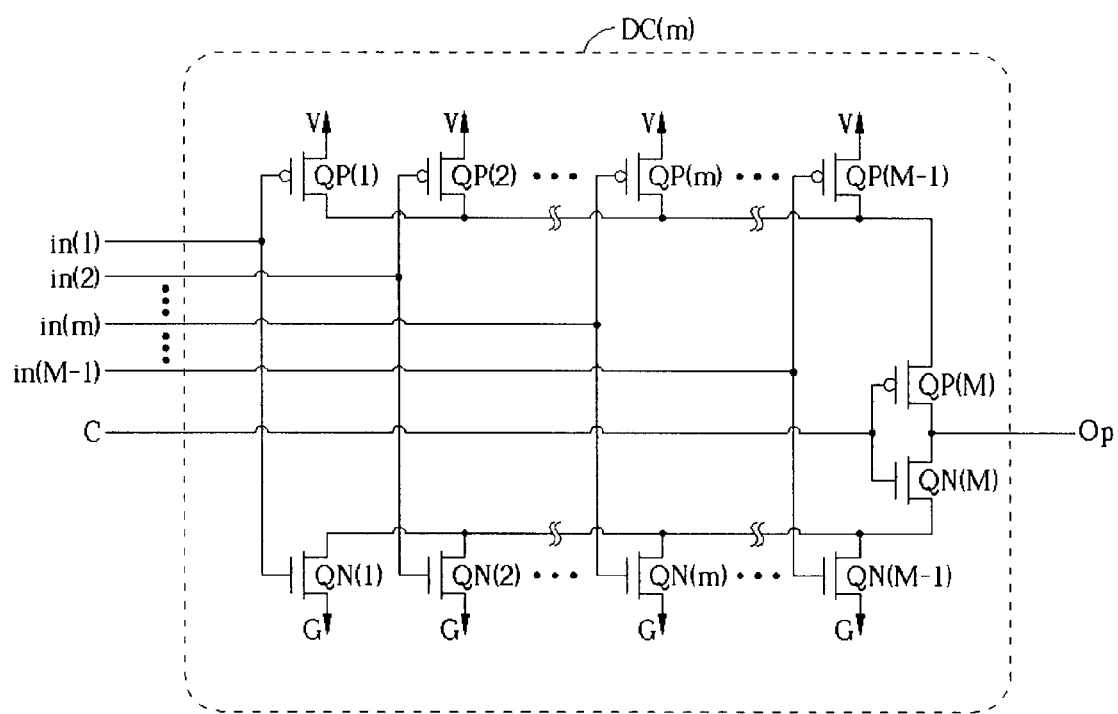
FIG. 14 is a schematic diagram showing the circuit layout of drive circuit in FIG. 13.

Summarizing the above, the frequency multiplication technology in the present invention uses M number signals having the same frequency and phase that are evenly distributed within 360 degrees to achieve an M times frequency multiplication. Please simultaneously refer to FIGS. 13 and 14, FIG. 13 is a schematic diagram showing the M times frequency multiplication by a frequency multiplication circuit 400 using M number of signals S(1), S(2) . . . , to S(M). The frequency multiplication circuit 400 comprises M numbers of drive circuits DC(1), DC(2) . . . , DC(M) for matching the number of signals to form a drive module 410. An inverter 144 is provided to generate an output signal 401B. FIG. 14 is a schematic diagram of the drive module DC(m).

Figure 3:
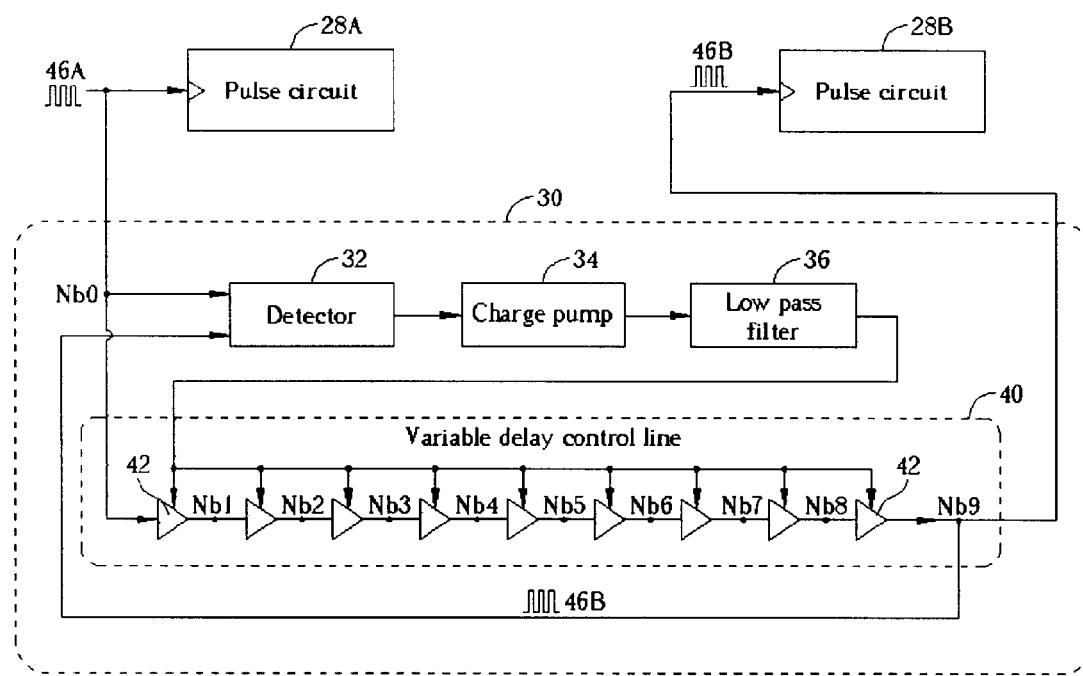
FIG. 3 is a block diagram of a conventional delay phase-locked loop according to prior art.

As illustrated in FIG. 13, the drive circuits DC(m) comprises (M-1) numbers input terminals in(1), in(2) . . . , to in(M-1), a control terminal C, and an output terminal 0p. The output terminal 0p of each drive circuit DC(m) is electrically connected to the junction Ne to form the output terminal for the drive module 410. In accordance to the M number of input signals S(1) to S(M), the drive circuits DC(m) has S(m) number of control signals (m is equal to 1, 2. . . , or M) inputted to the control terminal C and (M-1) number of input signals inputted to input terminals in(1) to in(M-1). In FIG. 14, each drive circuit DC(m) comprises M numbers of p-type semi-conductors QP(1) to QP(M), M numbers of n-type semi-conductors QN(1) to QN(M). The voltage of the source of the semi-conductors QP(1) to QP(M-1) is at level high of the DC V and the voltage of the source of the semi-conductors QN(1) to QN(M) is at a level low of the DC G. Similar to the operation mode of the drive circuits in FIGS. 6 and 10, the signal S(m) at the control terminal C of the drive circuits DC(m) is at level high causes the channel of the semi-conductor QN(M) and QP(M) to close. Then the input signals at the input terminals in(1) to in(M-1) conduct the channels of the semiconductor QN(1) and QN(M-1) at high level so the drive circuits DC(m) discharges the voltage of the output terminal Op to level low. When the signal S(m) at the control terminal C is at level low, the semi-conductor QN(M) is switched off but the semi-conductor QP(M), therefore the input signals at the input terminals in(1) to in(M-1) conduct the channels of the semi-conductor QP(1) and QP(M-1) at low level so the drive circuits DC(m) charges the voltage of the output terminal 0p to the DC V at level high. As illustrated in FIG. 3, the signals S(1) to S(M) inputted to the control terminal C of each drive circuit DC(1) to DC(M) are in different phase therefore each drive circuit DC(1) to DC(M) can individually discharge or charge the voltage of the junction Ne. Combining all the discharging and charging of the junction Ne by the drive circuits DC(1) to DC(M), the inverter 144 outputs a M times frequency multiplication signal 401B to the signals S(1) to S(M). In this embodiment of the present invention, an odd number of signals S(1) to S(M) (i.e. M is an odd number) is used to independently control the drive circuits DC(1) to DC(M). The signals S(1) to S(M) are evenly distributed within 360 degrees and at the same time an unequal number of drive circuits perform either discharge and charge action to generate the output signal 401B having a M times frequency multiplication.

In the embodiment exemplified in FIGS. 4 and 8 of the present invention, the original signals having the same frequency but different phase generated by a phase-locked loop or a delay-locked loop are used to generate M numbers of signals S(1) to S(M) evenly distributed within 360 degrees to attain the frequency multiplication by the frequency multiplication circuit 400 of the present invention. For example in a voltage oscillator of a phase-locked loop or a variable control delay line of a delay-locked loop having M*M differential buffers of buffers, the N(N=M*M) number of signals W(1) to W(N) outputted from the differential buffers or buffers are used as the preliminary signals. According to the above description, the signals W(1) to W(N) are evenly distributed within 360 degrees so the phase difference between the nth signal W(n) and the first signal W(1) is (360*(n−1)/N) for n=1, 2. . . , n). For m=1, 2. . . , M, the signals W(m0+(m−1)*M) are used as signals S(m) to form M number of input signals S(1) to S(M) having the same frequency and phase to attain the frequency multiplication by the frequency multiplication circuit 400 (where m0 is an integer, i.e. 1, 2, or M) of the present invention as shown in FIG. 13.

In contrast to the prior art, the conventional phase-locked loop lacks flexibility and margin for error so it is often required to redesign the entire phase-locked loop circuitry in order to achieve a phase-locked loop having different frequency multiplication ratios which wastes time and resources in redesigning and manufacturing. The conventional delay-locked loop provide limited operation no the pulse. Comparatively using the frequency multiplication circuit of the present invention in a phase-locked loop and delay-locked loop increases the frequency multiplication function and broadens the operation of the pulse of the delay-locked loop which leads to increased design flexibility and margin and at the same time reduces circuit design, manufacturing cost, and resources. Using 0.18 mm semiconductor fabrication for the five times frequency multiplication circuit in FIG. 8 of the present invention, the actual size of the layout is 31.5 mm*23.5 mm which is significantly smaller than the conventional 500 mm*500 mm phase-locked loop or delay-locked loop. The present invention not only reduces the size of the circuit but also at the same time increases the performance of the phase-locked loop or delay-locked loop that proves the contribution of the present invention.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A method for generating a high frequency output signal by a plurality of low frequency reference signals, the method comprising:

receiving a plurality of reference signals, wherein a period of each reference signal is identical, a phase difference is predetermined between the reference signals, a signal level of each reference signal in each period fluctuates between a level high and a level low; and defining the signal level of the output signal as a first level when a number of reference signals belonging to the level high is greater than a number of reference signals belonging to the level low and defining the signal level of an output signal as a second level when a number of reference signals belonging to the level high is smaller than a number of reference signals belonging to the level low, wherein the first level and the second level is non-identical.

2. The method of claim 1, wherein the phase difference of the plurality of reference signals is evenly distributed within a corresponding period.

3. The method of claim 1, wherein a number of low frequency reference signals is odd.

4. The method of claim 1 further comprising:

generating the plurality of reference signals according to a plurality of input signals, the generating a plurality of input signals further comprising:

defining a control signal from one of the input signals and using the rest of the input signals as triggering signals when generating the reference signal, after the control signal changes from the level low to level high but if one of the trigger signals is at level high the reference signals maintain at the level low, after the control signal changes from the level high to level low but if one of the trigger signals is at the level low the reference signals maintain at level high.

5. The method of claim 4, wherein generating a plurality of signals comprising:

generating different reference signals by using different input signals among the plurality of input signals.

6. The method of claim 4, wherein the plurality of input signals has an identical period but a predetermined phase difference.

7. The method of claim 6, wherein the phase difference between the input signals is evenly distributed within a corresponding period.

8. The method of claim 4 further comprising:

generating a plurality of preliminary signals so that the preliminary signals have an identical period but a predetermined phase difference; and selecting a set of preliminary signals among the plurality of preliminary signals to be the input signals.

9. The method of claim 8, wherein a number of preliminary signals is a square of a number of input signals.

10. The method of claim 8, wherein the phase difference of the preliminary signals is evenly distributed within a corresponding period.

11. The method of claim 4, wherein when generating a plurality reference signals the period of the reference signals is identical to a period of the control signal.

12. The method of claim 4 further comprising:

a phase-locked loop (PLL) for generating the plurality of input signals.

13. The method of claim 4 further comprising:

a delay-locked loop (DLL) for generating the plurality of input signals.

14. A signal circuit comprising:

a frequency multiplication circuit for generating a high frequency output signal by a plurality of low frequency reference signals, the frequency multiplication circuit comprising:

a drive module for generating the output signal according to the plurality of reference signals, wherein a period of the reference signals is identical, a phase difference is predetermined between the reference signals, a signal level of each reference signal in each period fluctuates between a level high and a level low, and for defining the signal level of the output signal as a first level when a number of reference signals belonging to the level high is greater than a number of reference signals belonging to the level low and defining the signal level of the output signal as a second level when a number of reference signals belonging to the level high is smaller than a number of reference signals belonging to the level low, wherein the first level and the second level is non-identical; and an output terminal electrically connected to the drive module for outputting the output signal.

15. The circuit in claim 14, wherein the phase difference of the plurality of reference signals is evenly distributed within a corresponding period.

16. The circuit in claim 14, wherein a number of low frequency reference signals is odd.

17. The circuit in claim 14, wherein the drive module further comprising:

a plurality of drive circuits corresponding to the reference signals, wherein each drive circuit generate one corresponding reference signal according to a plurality of input signals, each drive circuit comprising:

a plurality of input terminals comprising an input terminal for receiving one input signal as a trigger signal; and a control terminal for receiving one input signal as a control signal among the plurality of input signals, and for setting the reference signals at level low after the control signal changes from the level low to level high but if one of the trigger signals is at level high and setting the reference signals maintain at the level high after the control signal changes from the level high to level low but if one of the trigger signals is at the level low.

18. The circuit in claim 17, wherein the drive circuit receives different input signals as the control signal to generate different reference signals.

19. The circuit in claim 17, wherein a period of the plurality of the input signals is identical but a phase difference between each input signal is predetermined.

20. The circuit in claim 19, wherein the phase difference of the inputs signals is evenly distributed within a corresponding period.

21. The circuit in claim 17 further comprising:

a phase-locked loop or delay-locked loop for generating a plurality of preliminary signals so that the preliminary signals have an identical period but a different predetermined phase difference and selecting a set of preliminary signals among the plurality of preliminary signals to be the input signals.

22. The circuit in claim 21, wherein a number of preliminary signals is a square of a number of input signals.

23. The method of claim 21, wherein the phase difference of the preliminary signals is evenly distributed within a corresponding period.

24. The method of claim 17, wherein each drive circuit sets the period of the reference signals identical to a period of the control signal.

* * * * *